(12) United States Patent
Wu et al.

(10) Patent No.: US 10,298,382 B2
(45) Date of Patent: May 21, 2019

(54) 1-16 AND 1.5-7.5 FREQUENCY DIVIDER FOR CLOCK SYNTHESIZER IN DIGITAL SYSTEMS

(71) Applicant: OmniVision Technologies, Inc., Santa Clara, CA (US)

(72) Inventors: Charles Qingle Wu, Palo Alto, CA (US); Qi Niu, Shanghai (CN)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 15/673,298

(22) Filed: Aug. 9, 2017

(65) Prior Publication Data

US 2017/0373825 A1 Dec. 28, 2017

Related U.S. Application Data

(63) Continuation-in-part of application No. 15/191,147, filed on Jun. 23, 2016, now abandoned.

(51) Int. Cl.

| | |
|---|---|
| *H04L 7/033* | (2006.01) |
| *H04L 7/08* | (2006.01) |
| *G11B 20/14* | (2006.01) |
| *H03L 7/099* | (2006.01) |
| *H03L 7/085* | (2006.01) |

(Continued)

(52) U.S. Cl.
CPC .............. *H04L 7/0331* (2013.01); *G06F 1/08* (2013.01); *G06F 7/68* (2013.01); *G11B 20/1423* (2013.01); *H03C 3/0925* (2013.01); *H03C 3/0933* (2013.01); *H03L 7/085* (2013.01); *H03L 7/0991* (2013.01); *H03L 7/18* (2013.01)

(58) Field of Classification Search
CPC combination set(s) only.
See application file for complete search history.

(56) References Cited

U.S. PATENT DOCUMENTS

| | | | |
|---|---|---|---|
| 3,571,728 A | | 3/1971 | Andrea et al. |
| 4,866,544 A | * | 9/1989 | Hashimoto ........ G11B 20/1426 360/40 |

(Continued)

OTHER PUBLICATIONS

Taiwanese Patent Application No. 106120211, English translation of Office Action dated Mar. 29, 2018, 4 pages.

(Continued)

*Primary Examiner* — An T Luu
(74) *Attorney, Agent, or Firm* — Lathrop Gage LLP

(57) ABSTRACT

A frequency divider unit has a digital frequency divider configured to divide by an odd integer, and a dual-edge-triggered one-shot coupled to double frequency of an output of the digital frequency divider. The frequency divider unit is configurable to divide an input frequency by a configurable ratio selectable from at least non-integer ratios of 1.5, 2.5, and 3.5. In embodiments, the frequency divider unit relies on circuit delays to determine an output pulsewidth, and in other embodiments the output pulsewidth is determined from a clock signal. In embodiments, the unit is configurable to divide an input frequency by a configurable ratio selectable from at least non-integer ratios of 1.5, 2.5, 3.5, 4.5, 5.5, 6.5, and 7.5 as well as many integer ratios including 2, 4, 6, and 8. In embodiments, the digital frequency divider is configurable to provide a 50% duty cycle to the one-shot.

15 Claims, 8 Drawing Sheets

(51) Int. Cl.
    *G06F 7/68*     (2006.01)
    *G06F 1/08*     (2006.01)
    *H03C 3/09*     (2006.01)
    *H03L 7/18*     (2006.01)

(56) References Cited

U.S. PATENT DOCUMENTS

| | | | |
|---|---|---|---|
| 5,111,455 A * | 5/1992 | Negus | H04J 3/047 |
| | | | 327/407 |
| 5,430,890 A | 7/1995 | Vogt et al. | |
| 5,959,481 A | 9/1999 | Donnelly et al. | |
| 6,417,704 B1 | 7/2002 | Nakajima et al. | |
| 6,633,184 B2 * | 10/2003 | Idei | H03D 13/004 |
| | | | 327/12 |
| 6,738,449 B2 | 5/2004 | Dalt | |
| 9,065,449 B2 * | 6/2015 | Atesoglu | H03K 5/1565 |
| 9,915,684 B2 * | 3/2018 | Iikura | G01R 13/0218 |
| 2008/0048901 A1 | 2/2008 | Cormier | |
| 2008/0297209 A1 | 12/2008 | Scuteri | |
| 2011/0163784 A1 | 7/2011 | Loeda | |

OTHER PUBLICATIONS

Non-Final Rejection corresponding to U.S. Appl. No. 15/191,147, dated May 9, 2017.
Taiwanese Patent Application No. 106120211, English translation of Office Action dated Oct. 16, 2018, 5 pages.
Floria (2011) "Divide by N clock," Available at: https://www.slideshare.net/DeepakFloria/divide-by-n-clock, pp. 29-30.

\* cited by examiner

1-16 AND 1.5-7.5 FREQUENCY DIVIDER FOR CLOCK SYNTHESIZER IN DIGITAL SYSTEMS

CLAIM TO PRIORITY

The present application is a continuation-in-part of, and claims priority to, U.S. patent application Ser. No. 15/191,147 filed 23 Jun. 2016, which is incorporated herein by reference.

FIELD OF THE INVENTION

The present invention relates to frequency dividers useful in phase-locked loop clock generation subsystems.

BACKGROUND

A phase-locked-loop clock generation system for a digital integrated circuit typically receives a reference frequency, and divides the reference frequency by a first constant to provide a first input to a phase detector. A local oscillator signal is divided by a second constant to provide a second input to the phase detector; an output of the phase detector controls frequency of the local oscillator. The local oscillator signal is then divided to provide a clock signal for the digital integrated circuit.

The counters of a clock frequency synthesis subsystem for a digital integrated circuit are often among the fastest switching devices of the circuit; flexibility in divide ratios of the counters in the phase-locked loop is often desirable since this permits locking to a greater range of reference frequencies while potentially permitting slower operation of the local oscillator.

SUMMARY

In an embodiment, a frequency divider unit has a digital frequency divider configured to divide by an odd integer, and a dual-edge-triggered one-shot coupled to double frequency of an output of the digital frequency divider. The frequency divider unit is configurable to divide an input frequency by a configurable ratio selectable from at least non-integer ratios of 1.5, 2.5, and 3.5. In embodiments, the frequency divider unit relies on circuit delays to determine an output pulsewidth, and in other embodiments the output pulsewidth is determined from a clock signal. In embodiments, the unit is configurable to divide an input frequency by a configurable ratio selectable from at least non-integer ratios of 1.5, 2.5, 3.5, 4.5, 5.5, 6.5, and 7.5 as well as a plurality of integer ratios including 2, 4, 6, and 8. In embodiments, the digital frequency divider is configurable to provide a 50% duty cycle to the one-shot.

In another embodiment, a method of dividing an input frequency by a non-integer ratio selectable from a group includes at least non-integer ratios of 1.5, 2.5, and 3.5 to provide an output includes dividing a clock signal by an odd integer to produce an intermediate signal frequency, and multiplying the intermediate signal frequency by two.

DETAILED DESCRIPTION OF THE EMBODIMENTS

Figure 1:
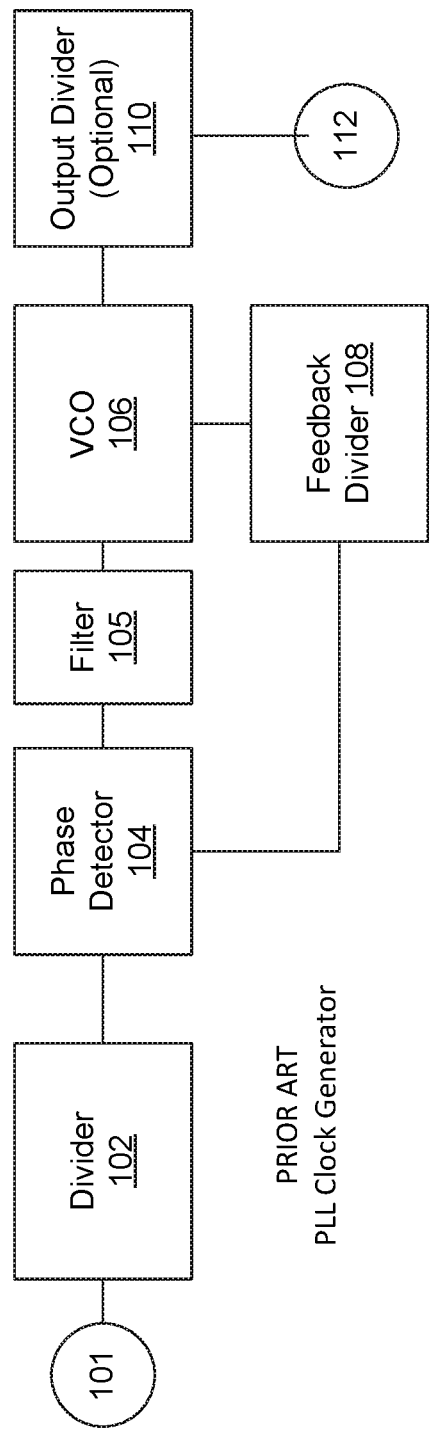
FIG. 1 is a block diagram of a phase-locked-loop frequency synthesis subsystem such as may be used in clock generation for digital ICs.

A phase-locked-loop clock frequency synthesis subsystem has general architecture as illustrated in FIG. 1. A reference clock 101 is provided to an input divider 102, an output of which is coupled to a phase detector 104. Phase detector 104 provides a control signal through a low pass filter 105 to a voltage-controlled oscillator 106. An output of the voltage controlled oscillator 106 is coupled through a second divider 108 to a second input of phase detector 104. An output of the voltage controlled oscillator 106 also drives, either directly or through an optional output divider 110, a clock output 112.

With circuits of the type shown in FIG. 1, flexibility of divide ratios in input divider 102, feedback divider 108, and optional output divider 110 are helpful in permitting operation of the clock frequency synthesis subsystem under a wide range of input reference frequency and desired output frequency combinations. We have developed a new high-speed divider stage 200 (FIG. 2) that allows for greater flexibility of divide ratios than prior designs.

Divider 200 receives an input, or raw clock signal 201, that is buffered by a gated clock tree circuit 202. Unless the divider is set to a divide ratio of unity by selecting raw clock signal 201 at 3:1 output multiplexor 226, gated clock tree circuit 202 provides a clock to a selected one of four dividers, first divider 204, second divider 206, third divider 208, and fourth divider 210; gated clock tree signals to the remaining three of the four dividers 204, 206, 208, 210 remain quiescent so that these remaining dividers draw no power as they are constructed of full-complementary MOS (CMOS) logic elements. First divider 204 is a simple divide-by-two divider. Second divider 206 is a divide-by-three divider. Third divider 208 is a programmable divider configurable to divide by 5, 7, or 9. Fourth divider 210 is a programmable divider configurable to divide by 11, 13, or 15. A first 3:1 multiplexor 212 selects an output from among odd-count dividers 206, 208, and 210, and an output of first divider 204 feeds fifth divider 214, which is a divide-by-two divider. A second 3:1 multiplexor 216 selects from an output of first 3:1 multiplexor 212, as well as outputs of first divider 204 and fifth divider 214.

In addition to the second 3:1 multiplexor 216, the output of first 3:1 multiplexor 212 also drives a frequency-doubler 218.

The output of second 3:1 multiplexor 216 drives a divide-by-two sixth divider 220, which in turn drives divide-by-two seventh divider 222; a third 3:1 multiplexor 224 is configured to select from outputs of second 3:1 multiplexor 216 and the sixth and seventh dividers 220 and 222. Finally, 3:1 output multiplexor 226 is configured to select between the output of third 3:1 multiplexor 224 as well as the output of the frequency doubler 218 and the raw clock to provide overall divider output 228. In some embodiments having a digital frequency doubler 218 that requires a high speed clock, gated clock tree 202 is configured to provide high speed clock to doubler 218 whenever multiplexer 226 is configured to select an output of doubler 218 instead of directly driving the high speed clock input of doubler 218 with raw clock 201.

Figure 2:
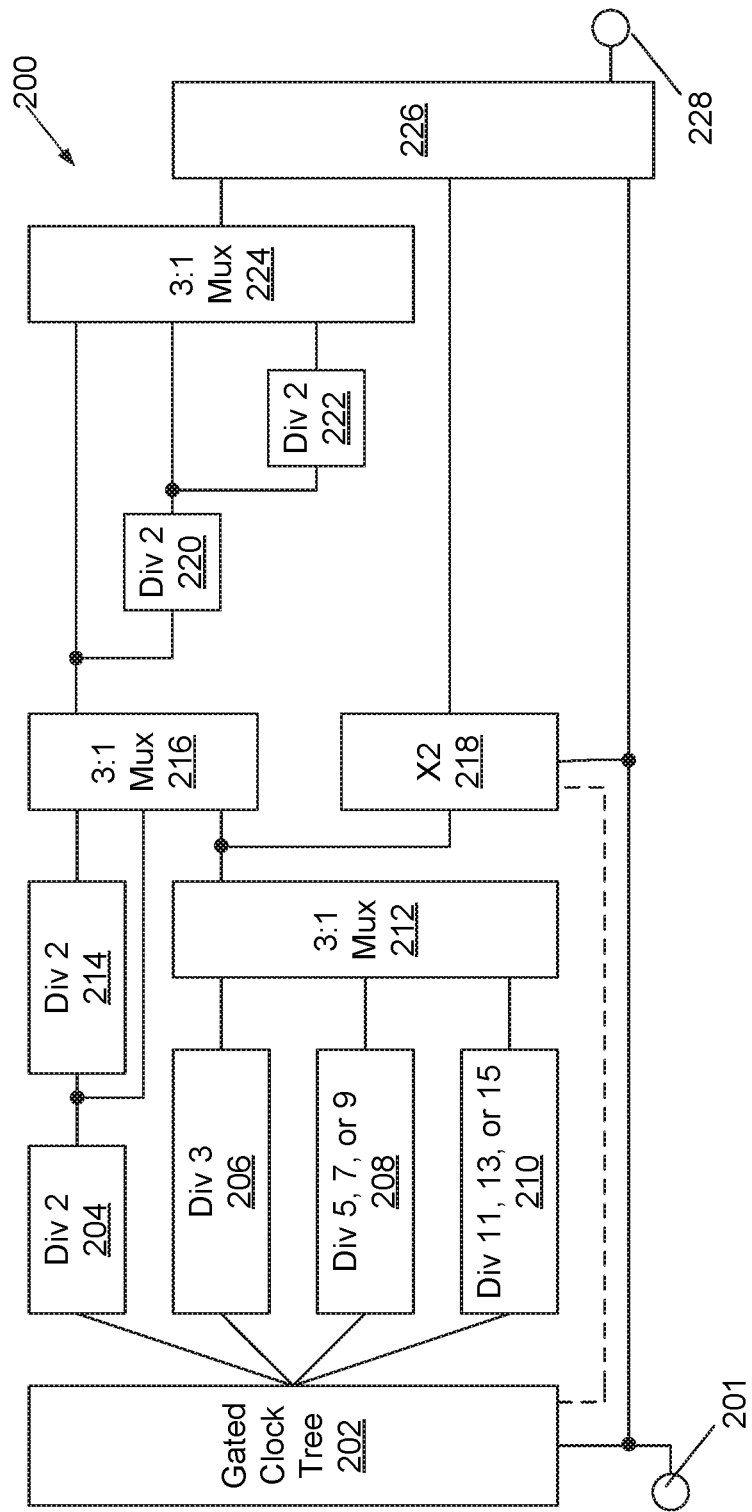
FIG. 2 is a block diagram of a multiple-ratio counter that may be used in the phase-locked-loop frequency synthesis subsystem of FIG. 1.

The divider of FIG. 2 is configurable by configuring gated clock tree 202 and settings of the first, second and third 3:1 multiplexors 212, 216 and 224, and 3:1 output multiplexor 226 to divide by any integer from one to sixteen, as well as other integers including 18, 20, 22, 26, 28, 30, 36, 44, 52, and 60.

Figure 3:
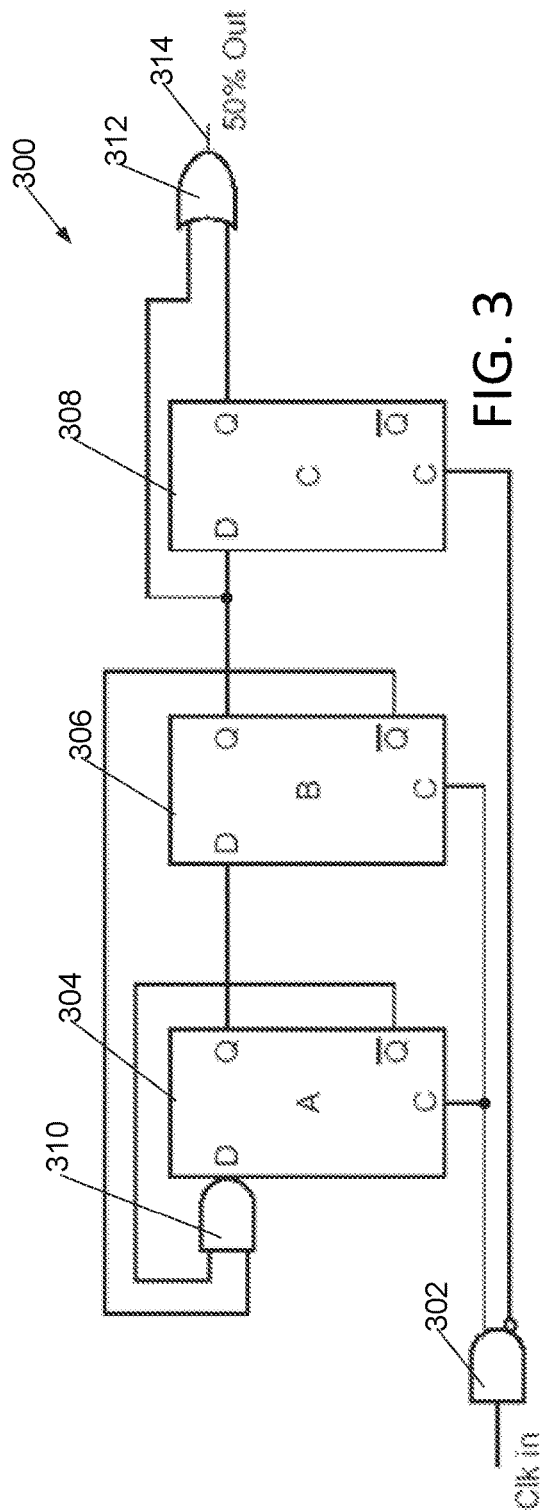
FIG. 3 is a schematic diagram of a 50%-duty-cycle, divide-by-3, circuit that may be used in the counter of FIG. 2.
Figure 4:
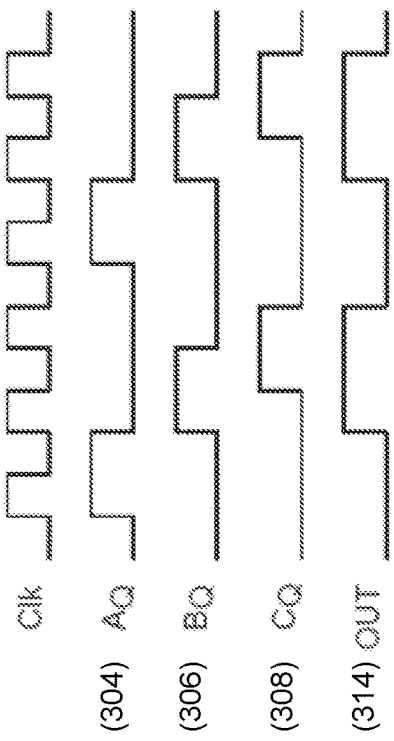
FIG. 4 illustrates example waveforms of the divider of FIG. 3.

In an embodiment, odd-count dividers 206, 208, 210 are configured to provide 50% duty cycle, or square-wave, outputs. FIG. 3 illustrates an odd-count divide-by-three divider 300 that may be used as divide-by-three divider 206 in an embodiment. The divider includes a clock buffer 302 to provide a locally buffered clock. A first and second divider edge-triggered flipflop 304, 306 are configured to trigger on a first edge of the locally buffered clock, in an embodiment a positive edge, while a third edge-triggered flipflop 308 is configured to trigger on an opposite, in an embodiment a falling, edge of the locally buffered clock. Other clock arrangements may be used, including arrangements where each flipflop receives a true and a complement clock signal. Combinatorial logic 310 provides a feedback to the divider 300. As illustrated in FIG. 4, combinatorial logic 312 and third edge-triggered flipflop 308 serve as a falling-edge extender to extend output from the divider an extra half cycle to provide a 50% nominal duty cycle at the divider output 314. In embodiments, each flipflop is provided with a reset signal (not shown) or feedback combinatorial logic 310 has a reset input (not shown) so that the divider can be initialized to a constant value, thereby making it easy to test the counter. Other odd-count dividers such as third divider 208, and fourth divider 210, may use similar techniques to achieve square-wave output in a similar manner to divider 300, if this function is not embedded in frequency doubler 218.

Figure 5:
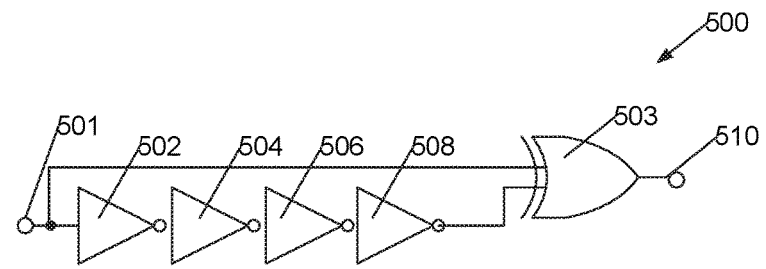
FIG. 5 is a schematic diagram of a frequency doubler that may be used in the counter of FIG. 2.

In an embodiment, frequency doubler 218 is a double-edge-triggered one-shot 500 as illustrated in FIG. 5. In this circuit, undelayed input clock 501 provides a first input to an exclusive-or (XOR) gate 503. A delay line of inverters 502, 504, 506, 508, which may incorporate capacitive loads (not shown) and be fed by undelayed input clock 501, provides a second input to XOR gate 503. The XOR gate drives doubler output 510 through any clock buffering circuits necessitated by loading on the doubler output. The one-shot circuit of FIG. 5 provides pulse widths that depend on circuit delays.

Figure 6A:
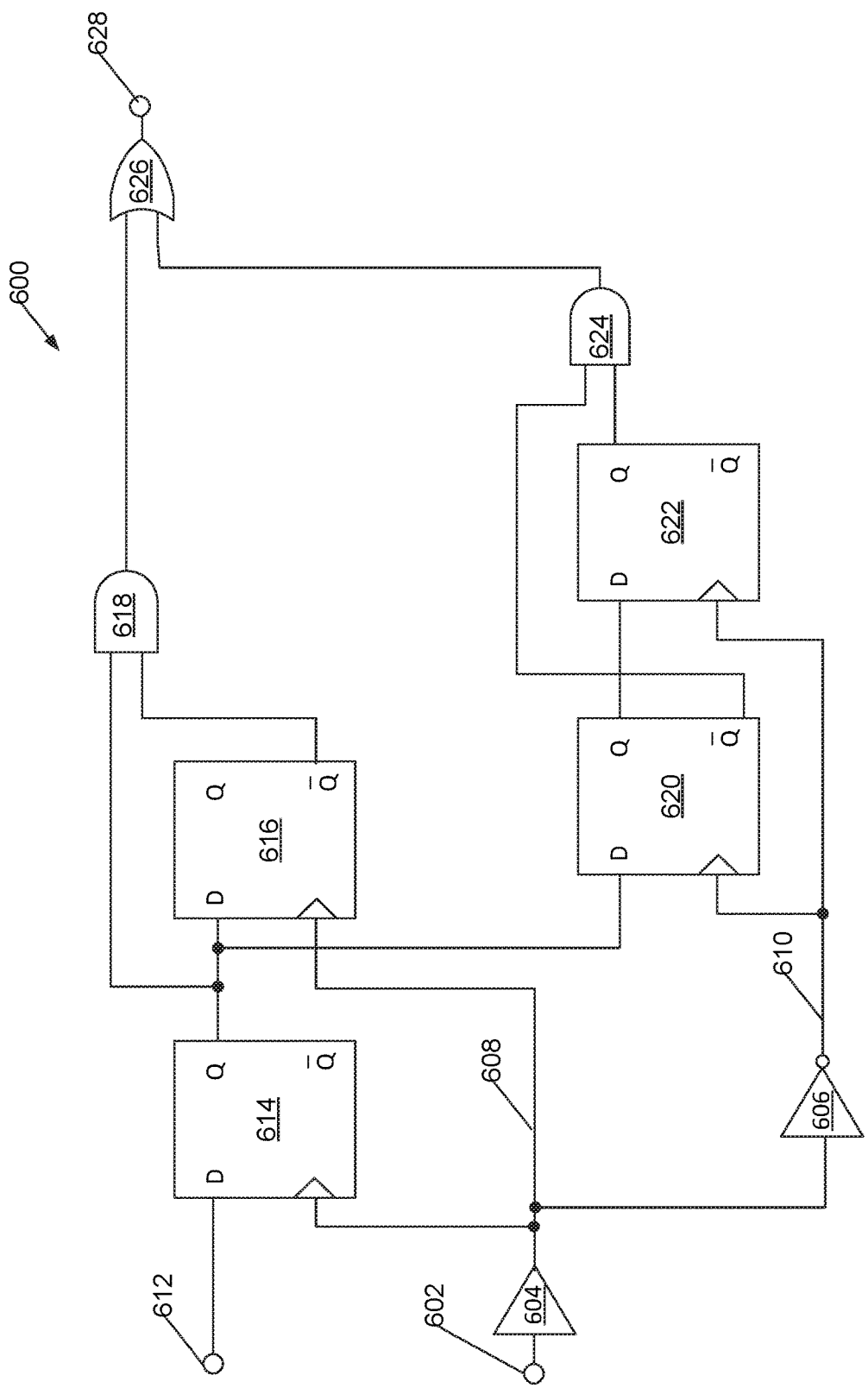
FIG. 6A is a schematic diagram of an alternative doubler that may be used in the counter of FIG. 2.

In an alternative embodiment, the raw clock signal 201 is used as a high-speed clock to drive a digital doubler 600 as illustrated in FIG. 6A. Raw clock 602 is buffered by buffer 604 and inverted by inverter 606, or buffered through a non-overlapping true-and-complement clock driver (not shown), to provide true 608 and complement 610 local clocks respectively. Output from first 3:1 multiplexor 212 is inputted into digital doubler 600 as a clock-to-be-divided 612 and is input to a positive-edge-triggered delay line formed by two edge-triggered flipflops 614, 616. Combinatorial logic 618 is provided to provide a pulse of one raw clock period on a 1-0 content of flipflops 614, 616, which occurs on rising edges of the clock-to-be-divided 612. The positive-edge-triggered delay line is tapped to feed a negative-edge-triggered delay line formed of two flipflops 620, 622, and combinatorial logic 624 is provided to generate a pulse of one raw clock period on a 0-1 content of flipflops 620, 622, which occurs on rising edges of the clock-to-be-divided 612 with an extra half cycle delay. The pulses from combinatorial logic 624 and 618 are combined in logic 626 to provide output clock 628. Further, the digital dual-edge-triggered one-shot of FIG. 6A provides an doubled-frequency pulse width and duty cycle dependent primarily on the raw clock frequency and divider configuration with less sensitivity to circuit delays than the embodiment of FIG. 5.

In an alternative embodiment, the input to negative-edge-triggered flipflop 620 is coupled to the clock-to-be-divided 612 instead of to an output of positive-edge-triggered flipflop 614. In embodiments, reset circuitry may be provided for the flipflops 614, 616, 620, 622 of FIG. 6A.

Figure 6B:
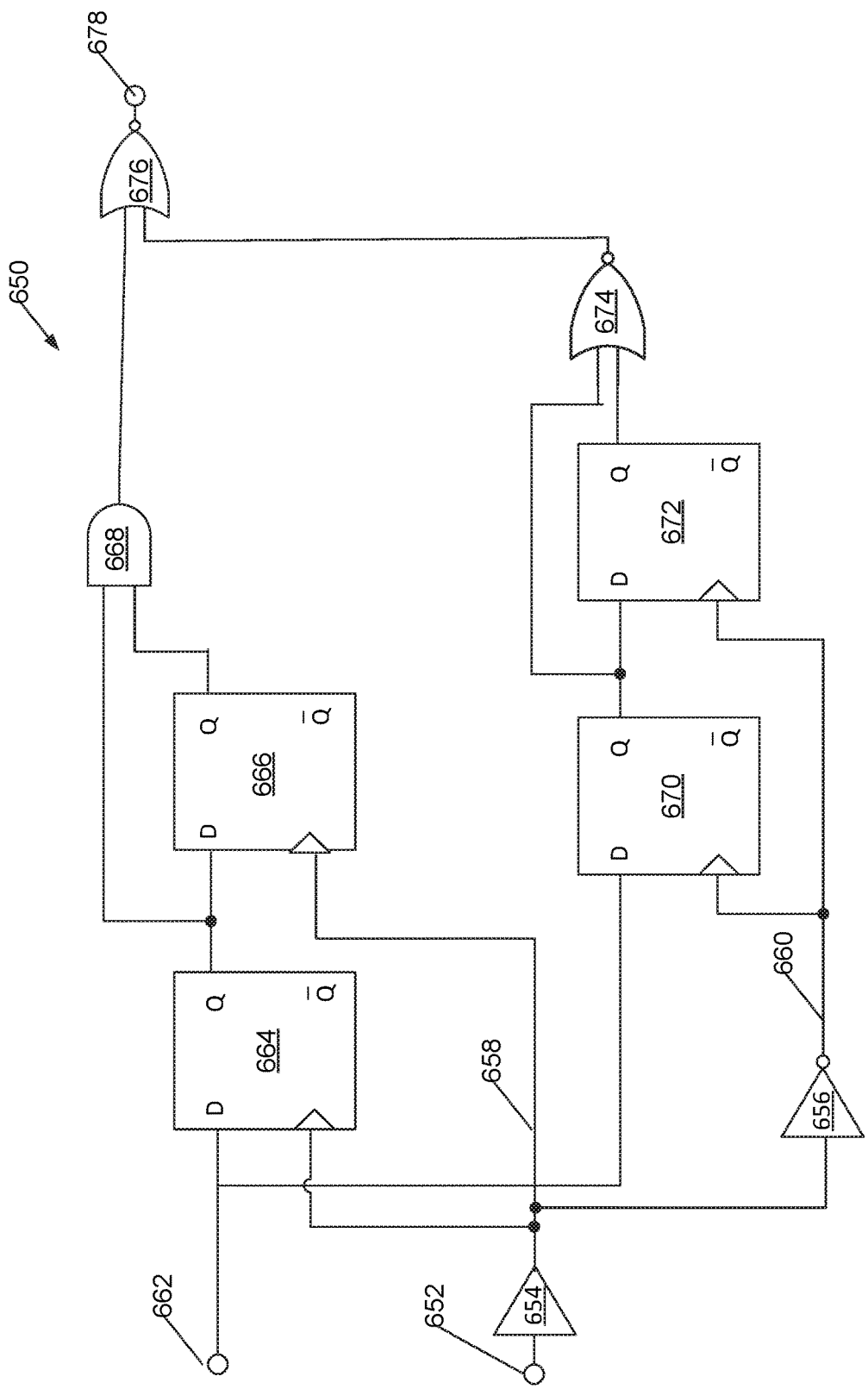
FIG. 6B is a schematic diagram of an alternative doubler that may be used in the counter of FIG. 2.

In an alternative embodiment, as illustrated in FIG. 6B, the raw clock signal 201 is used as a high-speed clock to drive digital doubler 650. Raw clock 652 is buffered by buffer 654 and inverted by inverter 656, or buffered through a non-overlapping true-and-complement clock driver (not shown), to provide true 658 and complement 660 local clocks respectively. Output from first 3:1 multiplexor 212 is inputted into digital doubler 650 as a clock-to-be-doubled 662 and is input to a positive-edge-triggered delay line formed by two edge-triggered flipflops 664, 666. Combinatorial logic 668 is provided to provide a logic "1" on a 1-1 content of flipflops 664, 666, which occurs 2 cycles after the rising edges of the clock-to-be-divided 662. The clock to be doubled 652 also feeds a negative-edge-triggered delay line formed of two flipflops 670, 672, and combinatorial logic 674 is provided to generate a logic "1" on a 0-0 content of flipflops 670, 672, which occurs 2 cycles after the falling edges of the clock-to-be-doubled 662. The pulses from combinatorial logic 674 and 668 are combined in logic 676 to provide output clock 678 that provides a pulse whenever neither flipflops 670, 672 are 0-0 nor flipflops 664, 666 are 1-1. The lengths of the positive-edge-triggered shift register formed by flipflops 664, 666 and the negative-edge-triggered shift register formed by flipflops 670, 672 can be adjusted according to expected frequencies at clock-to-be-divided 662 to provide a reasonably symmetrical waveform at doubled clock output 678; shorter shift registers provide operation at higher frequencies of clock to be doubled 662, while longer shift registers give longer pulse outputs, and more nearly symmetrical output waveforms, at lower frequencies of clock to be doubled 662.

Figure 6C:
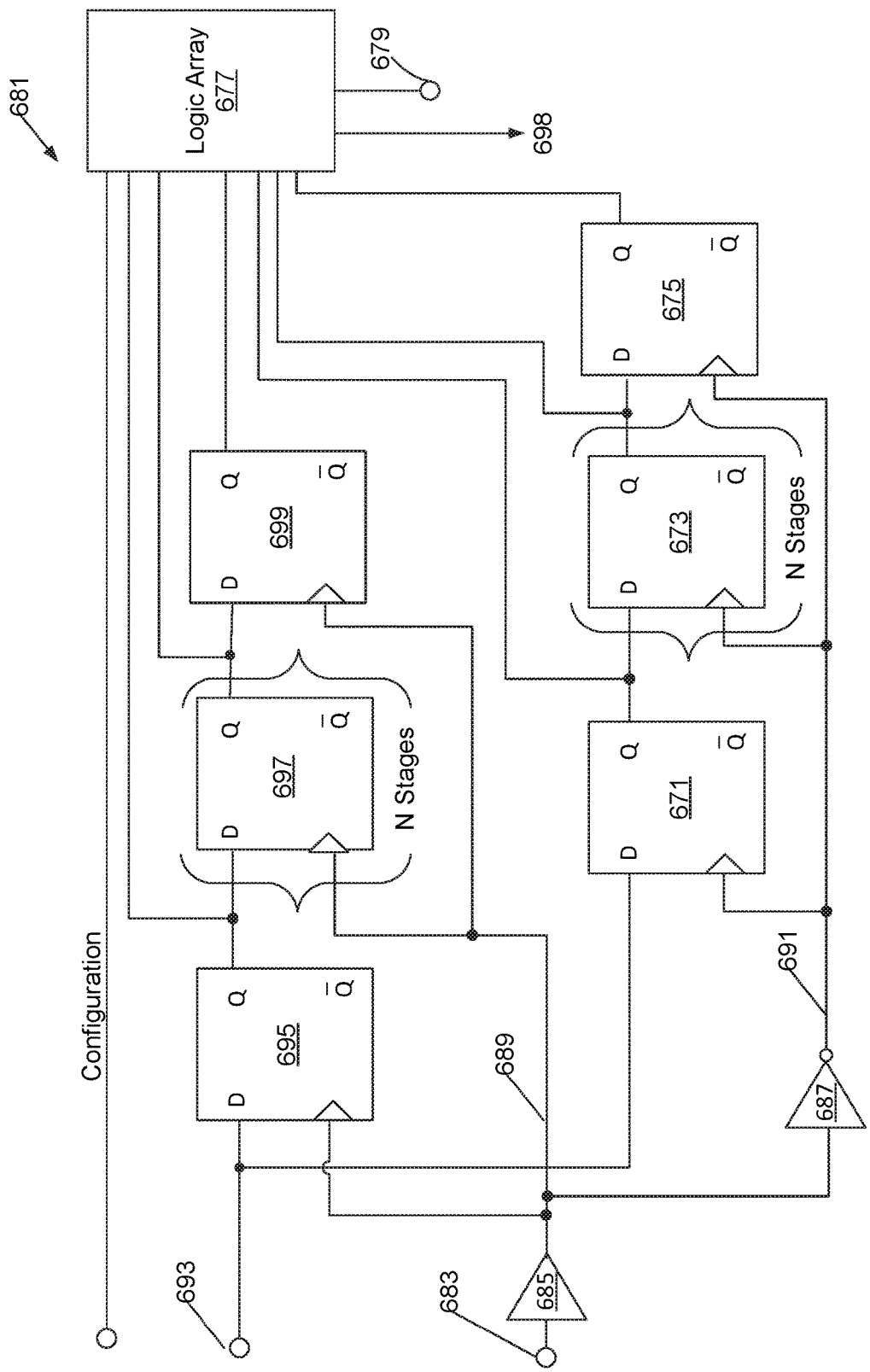
FIG. 6C is a schematic diagram of an alternative doubler that may be used in the counter of FIG. 2.

In an alternative embodiment, as illustrated in FIG. 6C, the raw clock signal 201 is used as a high-speed clock raw clock 683 to drive digital doubler 681. Raw clock 683 is buffered by buffer 685 and inverted by inverter 687, or buffered through a non-overlapping true-and-complement clock driver (not shown), to provide true 689 and complement 691 local clocks respectively. Output from first 3:1 multiplexor 212 is inputted into digital doubler 681 as a clock-to-be-doubled 693 and is input to a positive-edge-triggered delay line formed by N-plus-2 edge-triggered flipflops 695, 697, 699, where N is an integer greater than zero and determined by a designer according to desires for symmetry in the output doubled clock and the greatest divide ratio between raw clock 683 and clock-to-be-doubled 693. Similarly, the clock to be doubled 693 also feeds a negative-edge-triggered delay line formed of N-plus-2 flip-flops 671, 673, 675.

Outputs of both the positive-edge-triggered delay line formed by flipflops 695, 697, 699 and the negative-edge-triggered delay line 671, 673, 675 are provided to combinatorial logic array 677, together with configuration information 679. Configuration information 679 indicates a divide ratio between raw clock 683 and clock-to-be-doubled 693 implemented by preceding dividers, such as the combination of second, third, and fourth dividers 206, 208, 210, and first 3:1 multiplexor 212. Combinatorial logic array 677 provides pulses on clock output 698 on rising and falling edges of clock-to-be-doubled 683 by detecting those edges in the positive-edge-triggered and negative-edge-triggered delay lines, the width of each pulse on clock output 698 being of length determined by configuration information 679.

In an alternative embodiment 250 (FIG. 7) of the divider, divider 250 receives an input, or raw clock signal 251, that is buffered by a gated clock tree circuit 252. Unless the divider is set to a divide ratio of unity by selecting raw clock signal 251 at 3:1 output multiplexor 276, gated clock tree circuit 252 provides a clock to a selected one of four dividers, first divider 254, second divider 256, third divider 258, and fourth divider 260, with clock to the remaining three of the four dividers remaining quiescent. First divider 254 is a simple divide-by-two divider. Second divider 256 is a divide-by-three divider. Third divider 258 is a programmable divider configurable to divide by 5, 7, or 9. Fourth divider 260 is a programmable divider configurable to divide by 11, 13, or 15. A first 3:1 multiplexor 262 selects an output from among odd-count dividers 256, 258, and 260, and an output of first divider 254 feeds fifth divider 264, which is a divide-by-two divider. A second 3:1 multiplexor 266 selects from an output of first 3:1 multiplexor 262, as well as outputs of first divider 254 and fifth divider 264.

Figure 7:
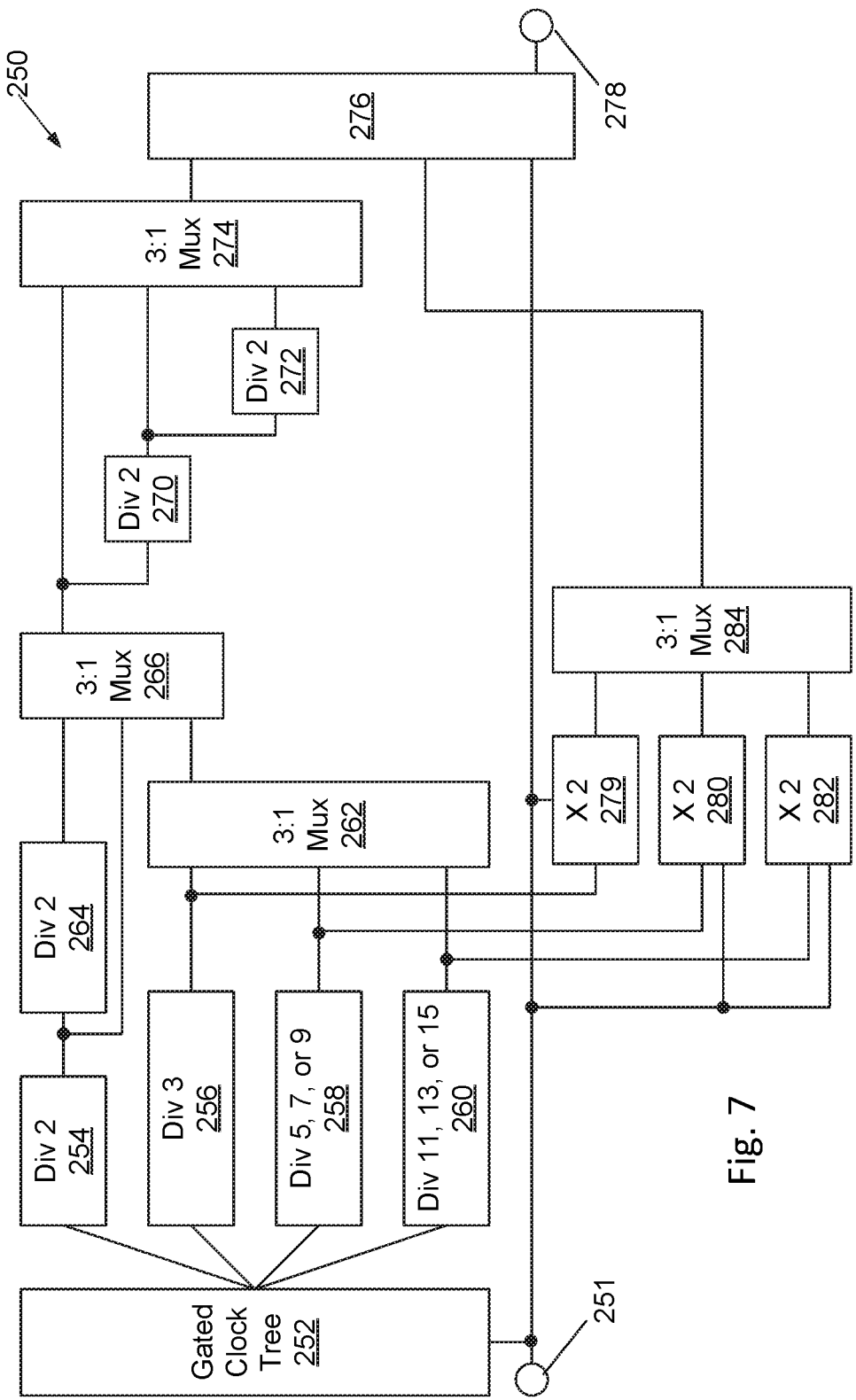
FIG. 7 is a block diagram of an alternative multiple-ratio counter that may be used in the phase-locked-loop frequency synthesis subsystem of FIG. 1.

The embodiment of FIG. 7 differs from that of FIG. 2 in that three separate frequency doubler circuits 279, 280, and 282 are provided instead of a single frequency doubler circuit 280, and that an additional doubler-selection 3:1 multiplexor 284, which in a particular embodiment has the same control inputs as first 3:1 multiplexor 262, is provided to select between outputs of each frequency doubler circuit 279, 280, 282. Frequency doubler circuit 279 is optimized for operation at high frequencies with a narrow pulse output, to roughly approximate a square wave at a frequency of 1/1.5 that of the raw clock 251. Frequency doubler circuit 280 is optimized for operation at midrange frequencies to give an approximate square-wave output at a frequency of 1/3.5 that of the raw clock 251. Frequency doubler circuit 282 is optimized for operation at lower frequencies to give an approximate square-wave output at a frequency of 1/6.5 that of raw clock 251.

The output of second 3:1 multiplexor 266 drives a divide-by-two sixth divider 270, which in turn drives divide-by-two seventh divider 272; a third 3:1 multiplexor 274 is configured to select from outputs of second 3:1 multiplexor 266 and the sixth and seventh dividers 270 and 272. Finally, 3:1 output multiplexor 276 is configured to select between the output of third 3:1 multiplexor 274 as well as the output of the multiplexor 284 that selects an active frequency doubler 279, 280, 282, and the raw clock to provide overall divider output 278.

The divider of FIG. 7 is configurable by configuring gated clock tree 252 and settings of the first, second and third 3:1 multiplexors 262, 266 and 274, doubler-selection 3:1 multiplexor 284, and 3:1 output multiplexor 276 to divide by any integer from one to sixteen, as well as other integers including 18, 20, 22, 26, 28, 30, 36, 44, 52, and 60.

Addition of frequency doublers 279, 280, 282 permits configuration of the divider to divide by non-integer frequency division ratios of 1.5, 2.5, 3.5, 4.5, 5.5, 6.5, and 7.5 as well as to divide by any integer from one to sixteen, as well as other integers including 18, 20, 22, 26, 28, 30, 36, 44, 52, and 60.

Figure 8:
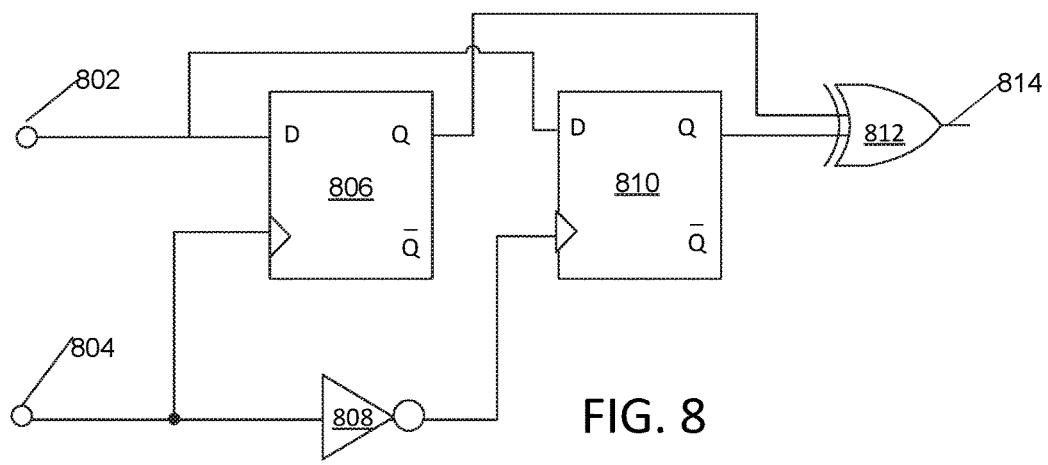
FIG. 8 is a block diagram of an alternative XOR-based frequency doubler.

The alternative embodiment of a doubler illustrated in FIG. 8 is configured to double a lower-speed clock 802 using an effective digital one-shot clocked by a higher-speed clock 804. Higher-speed clock 804 serves directly as clock to positive-edge-triggered D-flipflop 806, and is inverted by inverter 808 as clock to positive edge-triggered D-flipflop 810. Outputs of flipflops 806 and 810 are then exclusive-ored in XOR gate 812 to provide a pulse output 814, pulse output 814 will provide a pulse having width approximately one-half cycle of high-speed clock 804 whenever a change in lower-speed clock 802 occurs.

In an alternative embodiment, higher-speed clock 804 serves directly as clock to a negative edge-triggered D-flipflop that replaces D-flipflop 810.

We note that in many integrated circuit embodiments, circuits that are used as edge-triggered flipflops actually require both a true and a complement (inverted) clock input, these are often used to control pass-gates within the flipflop. In these circuits, the true and complement clocks may be generated locally or may be generated at a clock generator and coupled to the flipflop. Such dual-clock flipflops may serve, with appropriate clock connections, as any of the positive edge-trigger flipflops illustrated herein, or, with those clock connections reversed, as any of the clock-inverter and positive edge trigger flipflop combinations or negative edge-trigger flipflops illustrated herein.

The use of an analog (FIG. 5) or digital (FIG. 6A, 6B, 6C, or 8) dual-edge-triggered one-shot to double frequencies resulting from an odd frequency division, as described herein for odd divide ratios between 3 and 15, can be simplified for use with ratios between 3 and 7, or extrapolated to ratios between 3 and 31, 3 and 63, or greater. Further, the divider of FIG. 2 may have additional frequency division stages to permit division by greater divisors than 60.

Figure 9:
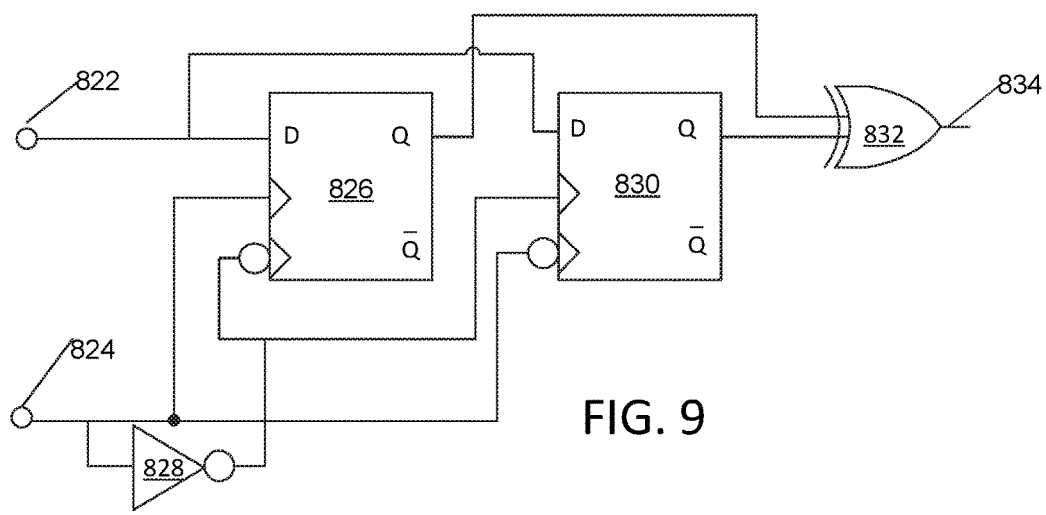
FIG. 9 is a block diagram of an alternative XOR-based frequency doubler using dual-clock D-flipflops.

The alternative embodiment of a doubler illustrated in FIG. 9 is configured to double a lower-speed clock 822 using an effective digital one-shot clocked by a higher-speed clock 824. Higher-speed clock 824 serves directly as positive clock to positive-edge-triggered D-flipflop 826 and negative clock to D-flipflop 830, and is inverted by inverter 828 as a negative clock to D-flipflop 826 and positive clock to positive edge-triggered D-flipflop 830. Outputs of flipflops 826 and 830 are then exclusive-ored in XOR gate 832 to provide a pulse output 834, pulse output 834 will provide a pulse having width approximately one-half cycle of high-speed clock 824 whenever a change in lower-speed clock 822 occurs, thereby providing pulses at twice the frequency of lower-speed clock 822.

In a particular embodiment of the programmable divider illustrated in FIG. 2, divide-by-3 divider 206 uses the circuit illustrated in FIG. 3, and doubler 218 uses the circuit illustrated in FIG. 8. In another particular embodiment of the programmable divider illustrated in FIG. 7, divide-by-3 divider 256 uses the circuit illustrated in FIG. 3 and doublers 279, 280, 282 use the circuit illustrated in FIG. 8. In these embodiments, gated clock tree 202, 252 provides clock selectively to one divider selected from the divide-by-two 204, 254, divide-by-three 206, 256, divide by five, seven, or nine 208, 258, and divide by eleven, thirteen, or fifteen 210, 260, while remaining quiescent on the three unselected dividers.

In embodiments, clock dividers according to FIG. 2 or FIG. 7 are provided in an image sensor integrated circuit. One such divider is used in a system clock divider, another is used to provide local clocks to an analog to digital converter, another provides clocks to DDR memory used to receive and buffer images, another provides clock to digital circuits, another a local clock to an MIPI D-PHY physical layer synchronous datalink as used to convey images from an image sensor integrated circuit to a smartphone processor, and in other places within the image sensor integrated circuit.

The term "exclusive-or gate" as used herein means a gate having at least a first and a second input and has a first output logic level when both the first and second input are at a same logic level, and a second output level when the first and second input are at different logic levels. As such, the term "exclusive-or gate" as used herein includes both gates known in the art as exclusive-nor gates and exclusive-or gates.

Combinations

Various features of the design can be combined in an assortment of ways. Among the combinations anticipated are:

A frequency divider unit designated A including a digital frequency divider configured to divide by an odd integer; and a dual-edge-triggered one-shot coupled to double frequency of an output of the digital frequency divider; the frequency divider unit being configurable to divide an input frequency by a configurable ratio selectable from at least non-integer ratios of 1.5, 2.5, and 3.5.

A frequency divider unit designated AA including the frequency divider unit designated A; wherein the dual-edge-triggered one-shot relies on circuit delays to determine a pulsewidth.

A frequency divider unit designated AB including the frequency divider unit designated A; wherein the dual-edge-triggered one-shot is a digital one-shot where a pulsewidth is determined from a clock signal.

A frequency divider unit designated AC including the frequency divider unit designated A, AA, or AB wherein the frequency divider is configurable to divide an input frequency by a configurable ratio selectable from at least non-integer ratios of 1.5, 2.5, 3.5, 4.5, 5.5, 6.5, and 7.5.

A frequency divider unit designated AD including the frequency divider unit designated A, AA, AB, or AC, wherein the frequency divider is configurable to divide an input frequency by a configurable ratio selectable from a plurality of integer ratios including 2, 4, 6, and 8 as well as the non integer ratios.

A phase locked loop clock synthesis subsystem including the frequency divider designated A, AA, AB, AC, or AD.

A frequency divider unit designated AE including the frequency divider unit designated A, AA, AB, AC, or AD wherein the frequency divider is configurable such that the dual edge-triggered one-shot receives an output of a divide-by-N stage having 50% duty cycle, where N is an odd integer selectable from a group including at least 3 and 5.

A method designated B of dividing an input frequency by a non-integer ratio selectable from a group including at least non-integer ratios of 1.5, 2.5, and 3.5 to provide an output including dividing a clock signal by an odd integer to produce an intermediate signal frequency; and multiplying the intermediate signal frequency by two.

A method designated BA including the method designated B wherein a pulsewidth of the output is determined by circuit delays in a one-shot circuit triggered by both rising and falling edges of the intermediate frequency.

A method designated BB including the method designated B wherein a pulse width of the output is determined from a clock signal.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween.

What is claimed is:

1. A divider system configured with gated clocks having a divider system output, the divider system comprising:
   a first divider configured to divide by a selectable divide ratio of five, seven, or nine and having a square-wave output;
   the first divider coupled to drive a frequency doubler coupled to drive an output with pulses having width determined from edges of a digital clock;
   the frequency doubler comprising:
      a first flipflop having a data input coupled to receive an output of the first divider and configured to trigger on a rising edge of the digital clock;
      a second flipflop having a data input coupled to receive a data input, and coupled to receive the output of the first divider and configured to trigger on a falling edge of the digital clock; and
      an exclusive-or gate coupled to receive an output from the first flipflop and an output from the second flipflop;
   a divide-by-3 divider having square-wave output and coupled to drive a second frequency doubler;
   a gated clock tree coupled to provide a gated clock to a selected one of the first divider and the divide-by-three divider, an unselected one of the first divider and the divide-by-three divider receiving a quiescent clock; and
   multiplexing circuitry adapted to select the divider system output from at least an output of the divide-by-3 divider, an output of the second frequency doubler, and an output of the first divider.

2. The divider system of claim 1 wherein the second frequency doubler comprises:
   a first flipflop having a data input coupled to receive an output of the divide-by-three divider and configured to trigger on a rising edge of an output of the gated clock tree;
   a second flipflop having a data input coupled to receive a data input, and coupled to receive the output of the divide-by-three divider and configured to trigger on a falling edge of the output of the gated clock tree; and
   an exclusive-or gate coupled to receive an output from the first flipflop and an output from the second flipflop.

3. A frequency divider system comprising:
   a first digital frequency divider configurable to divide by an odd integer and having a square-wave output; and a dual-edge-triggered one-shot coupled to double frequency of the square wave output of the first digital frequency divider;

wherein the frequency divider system is configurable to divide an input frequency by a configurable ratio selectable from at least non-integer ratios of 1.5, 2.5, and 3.5.

4. The frequency divider of claim 3, wherein the dual-edge-triggered one-shot relies on circuit delays to determine a pulsewidth.

5. The frequency divider of claim 4 wherein, the frequency divider is configurable such that the dual edge-triggered one-shot receives an output of a divide-by-N stage having 50% duty cycle, where N an odd integer selectable from a group comprising at least 3 and 5.

6. A frequency divider of claim 5 further comprising a phase detector coupled through a filter to a voltage controlled oscillator (VCO), to form a phase locked loop clock synthesis subsystem.

7. The frequency divider of claim 4 wherein, the frequency divider is configurable to divide the input frequency by a configurable ratio selectable from at least non-integer ratios of 1.5, 2.5, 3.5, 4.5, 5.5, 6.5, and 7.5.

8. The frequency divider of claim 7, wherein the frequency divider is configurable to divide the input frequency by a configurable ratio selectable from a plurality of integer ratios including 2, 4, 6, and 8 as well as the non-integer ratios.

9. The frequency divider of claim 3, wherein the dual-edge-triggered one-shot is a digital one-shot where a pulsewidth is determined from a clock signal.

10. The frequency divider of claim 9, wherein the frequency divider is configurable to divide the input frequency by a configurable ratio selectable from at least non-integer ratios of 1.5, 2.5, 3.5, 5.5, 6.5, and 7.5.

11. The frequency divider of claim 9, wherein the frequency divider is configurable such that the dual edge-triggered one-shot receives an output of a divide-by-N stage having 50% duty cycle, where N an odd integer selectable from a group comprising at least 3 and 5.

12. The frequency divider of claim 11, wherein the configurable ratio selectable from at least non-integer ratios of 1.5, 2.5, 3.5, 4.5, 5.5, 6.5, and 7.5 is further selectable from a plurality of integer ratios including 2, 4, 6, and 8.

13. A frequency divider of claim 9 further comprising a phase detector coupled through a filter to a voltage controlled oscillator (VCO), to form a phase locked loop clock synthesis subsystem.

14. A method of dividing an input frequency by a non-integer ratio selectable from a group comprising at least non-integer ratios of 1.5, 2.5, and 3.5 to provide an output, comprising:

dividing a clock signal by an odd integer to produce an intermediate signal frequency; and multiplying the intermediate signal frequency by two wherein the intermediate frequency has square wave waveform a pulse width of the output is determined by circuit delays in a one-shot circuit triggered by both rising and falling edges of the intermediate frequency.

15. The method of claim 14, wherein a pulse width of the output is determined from a clock signal.

* * * * *